United States Patent [19]
Mitzlaff

[11] Patent Number: 5,923,214
[45] Date of Patent: Jul. 13, 1999

[54] FEEDFORWARD AMPLIFIER NETWORK WITH SWEPT PILOT TONE FOR REDUCING DISTORTION GENERATED BY A POWER AMPLIFIER

[75] Inventor: James E. Mitzlaff, Arlington Heights, Ill.

[73] Assignee: Motorola, Inc., Schaumburg, Ill.

[21] Appl. No.: 08/992,419

[22] Filed: Dec. 17, 1997

[51] Int. Cl.⁶ .............................. H03F 3/66; H03F 1/26
[52] U.S. Cl. ............................................ 330/52; 330/151
[58] Field of Search ............................ 330/52, 149, 151;
332/123, 159, 160; 455/63; 375/297

[56] References Cited

U.S. PATENT DOCUMENTS 5,130,663  7/1992  Tattersall, Jr. .
5,307,022  4/1994  Tattersall, Jr. et al. ............. 330/151 X
5,455,537  10/1995  Larkin et al. .
5,528,196  6/1996  Baskin et al. .

*Primary Examiner*—Steven J. Mottola
*Attorney, Agent, or Firm*—Richard A. Sonnentag

[57] ABSTRACT

A feedforward amplifier network (42) generates a fixed offset frequency swept pilot tone (46) over at least the same frequency band as an input signal (40). The fixed offset frequency swept pilot tone (46) is a function of a variable frequency reference signal (52) and a fixed pilot tone clock signal (54). A mixer arrangement (66 and 70), as opposed to a phase lock loop arrangement, helps ensure that the fixed frequency offset can be generated over the swept range. In addition, the feedforward amplifier network (42) incorporates a delay (58) which is added to the variable frequency reference signal (52) and used by a pilot tone detector (57) so that the pilot tone generator (44) and pilot tone detector (57) are in synchronization over narrow bands to accommodate pilot tone detection in the presence of code division multiple access channels that are relatively close together.

12 Claims, 3 Drawing Sheets

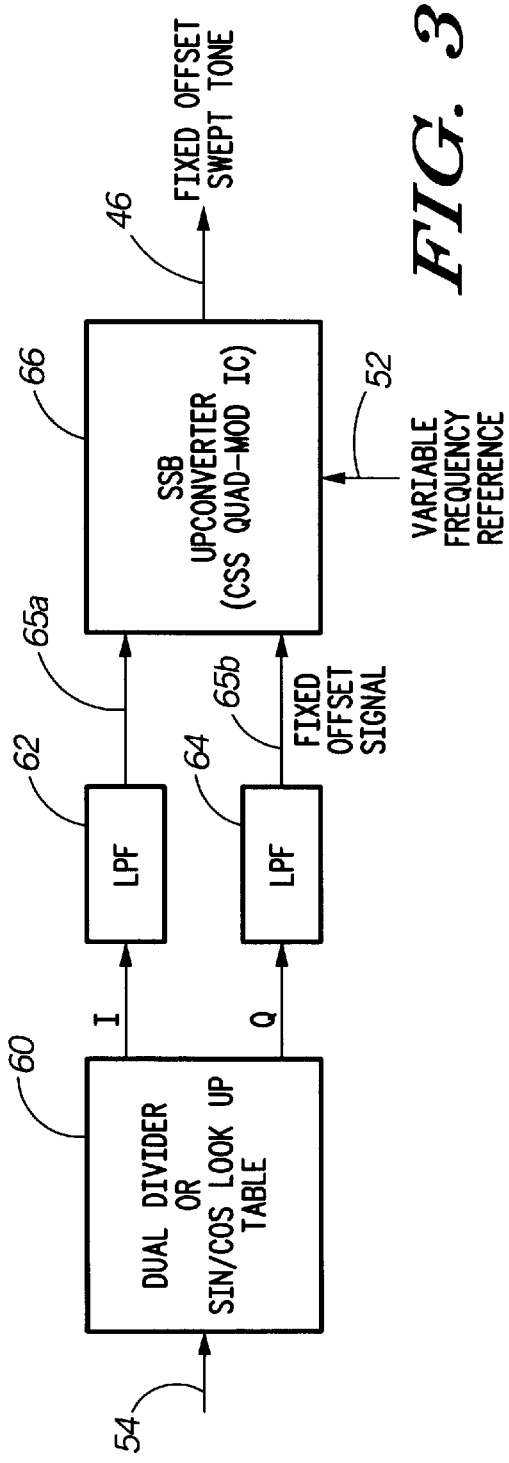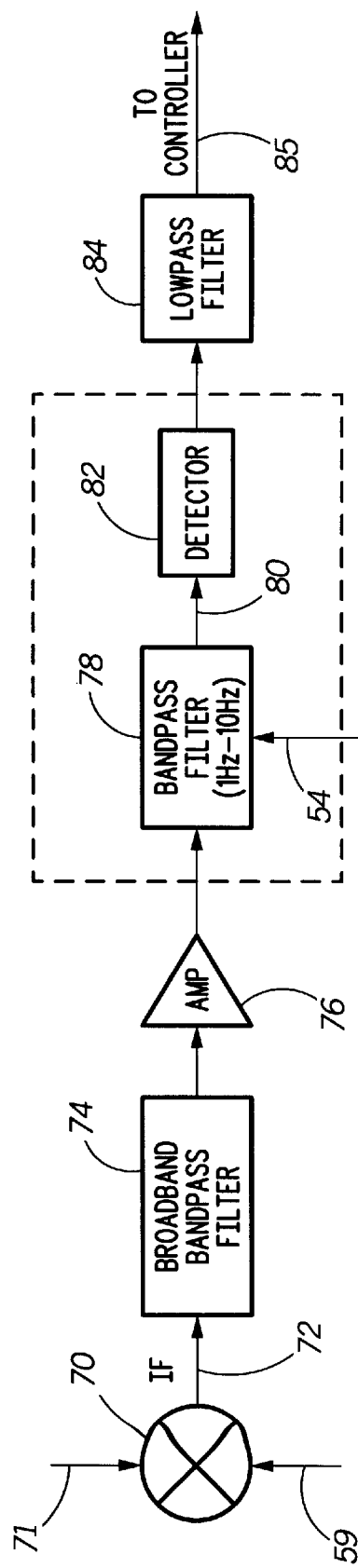

FEEDFORWARD AMPLIFIER NETWORK WITH SWEPT PILOT TONE FOR REDUCING DISTORTION GENERATED BY A POWER AMPLIFIER

FIELD OF THE INVENTION

The invention relates generally to power amplifiers and more particularly to power amplifier networks employing feedforward to reduce the distortion generated by the power amplifier during operation.

BACKGROUND OF THE INVENTION

Power amplifiers have a degree of non linearity in their transfer characteristic. This non linearity results in the distortion of the output signal so that it is no longer a perfect replica of an input signal. This distortion produces various signal components known as intermodulation products. Intermodulation products are undesirable because they cause interference, cross talk and other deleterious effects on the performance of the system employing the amplifier. Feedforward amplification for reduction of distortion is known and has been successfully applied to radio frequency amplifiers. Feedforward amplifiers typically separate out the distortion generated by a power amplifier and adds the distortion back into the power amplifier's output with gain, phase and delay adjusted for maximum cancellation.

A known feedforward approach includes the use of a test signal or pilot signal that is injected into the main signal path of the power amplifier. The magnitude of the pilot signal when detected at the amplifier output, is used by an automatic control circuit to adjust the gain and phase of signals in an error correction path of the amplifier in order to eliminate both the pilot and the distortion introduced by the power amplifier. The problem with some such amplifiers is that they inject only a single pilot tone which fails to provide a wide bandwidth solution to intermodulation product cancellation. As a result, other useful types of feedforward amplifier networks include the use of a frequency swept pilot tone signal that is continuously variable.

One such known system generally shown in FIG. 1 is disclosed in U.S. Pat. No. 5,130,663 assigned to instant assignee. In such a system, an input signal which may consist of a plurality of RF carriers, is routed between two signal paths by a directional coupler 2. In the main signal path, the input signal is amplified in main amplifier 4 and directed to output 6 through directional coupler 8, directional coupler 10, delay 12, and directional couplers 14 and 16. The input signal is delayed by delay circuit 18 in the feedforward signal path and phase and gain adjusted by the phase and gain adjuster 20 without distortion being introduced. The delay block 18 is set to compensate for the signal delay through the main amplifier and directional coupler 10. Directional couplers 10 and 22 permit a portion of the signal having a distortion component to be combined with the feedforward signal. If the amplitude and the phase of the feedforward input signal is properly adjusted the carrier components of the amplified signal from the directional coupler 10 will cancel the carrier components of the feedforward input signal, resulting in an error signal at the output of directional coupler 22. This process is often referred to as carrier cancellation.

The amplitude and the phase of the error signal is modified in amplitude and phase adjuster 24, amplified in error amplifier 26 and routed to directional coupler 14 where it is subtracted from the output of the main amplifier 4 via directional coupler 10 and delay 12. The time delay of delay 12 is set to compensate for the signal delay through directional coupler 22, gain and phase adjuster 24 and error amplifier 26. If the amplitude and the phase of the error signal is properly adjusted, the distortion component of the main signal path will be canceled, resulting in a clean signal at the main signal path output 6. To ensure proper distortion cancellation, pilot tone generator 28 produces a frequency swept pilot tone signal 30 which is injected into the path of the input signal via directional coupler 8 and delivered to the main amplifier 4. The amplitude of the pilot tone signal is controlled to be equal to the level of distortion components generated by the main amplifier 4. Consequently the error signal at the output of the directional coupler 22 is substantially representative of the distortion component introduced by the main amplifier 4 and the pilot tone signal 30.

To determine the extent of pilot tone cancellation, a pilot tone detector 32, which may be a narrow band pilot tone receiver, is phase locked or synchronized with the pilot tone generator 28 via a local oscillator signal 34. The pilot tone generator 28 and pilot tone detector 32 operate off the same reference signal 34 and can identify pilot tone signals despite the presence of additional signals on the main amplifier output path provided the input signal frequencies are spread far enough apart to allow detection of the pilot tone signal between the carriers.

However, a problem arises with such systems when the input signal includes carriers that are close together in frequency and amplitude so that the power from the carriers are uniformly spread. As a result, carrier power can overwhelm the pilot tone receiver. Such problems may arise when the system is used in radiotelephone systems employing code division multiple access (CDMA) channels. With such channels, the pilot tone detector may fail to suitably synchronize for the more stringent and closer carrier spectrum since the system does not provide for the gaps that would otherwise occur among the varying carriers of the input signal. Hence, a system such as the above may have difficulty during the presence of the full bandwidth of the multi-channel CDMA input signal.

Also, such systems typically utilize complex frequency synthesizers for the pilot generator and pilot tone detectors and typically employ phase locked loops for locking the common reference signal between the pilot tone generator and pilot tone detector. Such designs may introduce additional error over time when the reference signal frequency is swept since differing divide ratios in the pilot tone generator and pilot tone detector may cause the phase lock loop frequencies to move out of alignment. Moreover, a demand exists for smaller amplifiers that are more cost effective to allow additional features and circuitry to be placed on the same printed circuit boards.

Another type of feedforward amplifier is disclosed in U.S. Pat. No. 5,528,196. Such a system employs a pilot signal which lies outside of the operating frequency band but within the pass band of the system and generally uses a fixed frequency pilot tone signal. This design utilizes a mixer arrangement instead of a phase lock loop arrangement but also utilizes a bandpass filter for the pilot tone detector which can prevent sweeping of the pilot signal frequency across the necessary band. Also, it is desirable to use pilot signals that are spread across the operating frequency band to get a more accurate representation of how the linear amplifier performs (distorts) when amplifying desired signals.

Moreover, current pilot tone alignment schemes generally require a substantial amount of radio frequency hardware and elaborate control software which leads to the need for high end microprocessors to implement the control software. The sheer size of the circuitry creates problems for future generation products that require 200% to 400% size reduction.

Therefore, there exists a need for a feedforward amplifier network for reducing distortion generated by a power amplifier that utilizes pilot tone cancellation techniques which can provide improved distortion reduction for systems having input signals where carriers are relatively close together in frequency. It would also be advantageous if such a system and method detected and reduced distortion with pilot tones that are within a same frequency band as an input signal to the power amplifier. In addition, such a system should afford cost advantages and allow smaller size amplifiers to be implemented for desired systems.

BRIEF DESCRIPTION OF THE DRAWINGS

FIG. 3 is a block diagram generally illustrating one embodiment of a pilot tone generator in accordance with one embodiment of the invention; and FIG. 4 is a block diagram generally illustrating one embodiment of a pilot tone detector in accordance with one embodiment of the invention.

DETAILED DESCRIPTION OF THE PREFERRED EMBODIMENT

A feedforward amplifier network for reducing distortion generated by a power amplifier uses a pilot tone generator to generate a fixed offset frequency swept pilot tone over at least the same frequency band as an input signal to the power amplifier. The fixed offset frequency swept pilot tone is a function of a variable frequency reference signal and a fixed pilot tone clock signal. A mixer arrangement, as opposed to a phase lock loop arrangement, helps ensure that the fixed frequency offset can stay fixed irrespective of the frequency of the swept variable frequency reference signal. In addition, the feedforward amplifier network incorporates a delay which is added to the variable frequency reference signal and used by the pilot tone detector so that the pilot tone generator and pilot tone detector are in synchronization over narrow bands to accommodate detection of the pilot tone in the presence of carriers or channels that are relatively close together. Hence the pilot tone detector employs a narrow band amplitude detector to facilitate detection of the fixed offset frequency swept pilot tone in at least the same frequency band as the input signal. Preferably, although not by way of limitation, the narrow band amplitude detector has a bandpass filter having a bandwidth of between 1 Hz and 10 Hz. The use of the narrow bandpass filter affords a 70 dB to 60 dB power processing gain. This processing gain effectively suppresses all of the carrier signals present at the pilot amplifier output by approximately 70 dB allowing for the detection of very low level pilot signal in the presence of large carriers without the need to resort to carrier blanking techniques.

The variable frequency reference signal is generated by a voltage controlled oscillator which is very rapidly swept over a wide bandwidth, namely the linear power amplifier bandwidth plus the bandwidth of regions outside the linear power amplifier bandwidth where intermodulation cancellation is needed. The very narrow bandwidth pilot tone detector provides processing and signal gain as previously discussed.

Figure 1:
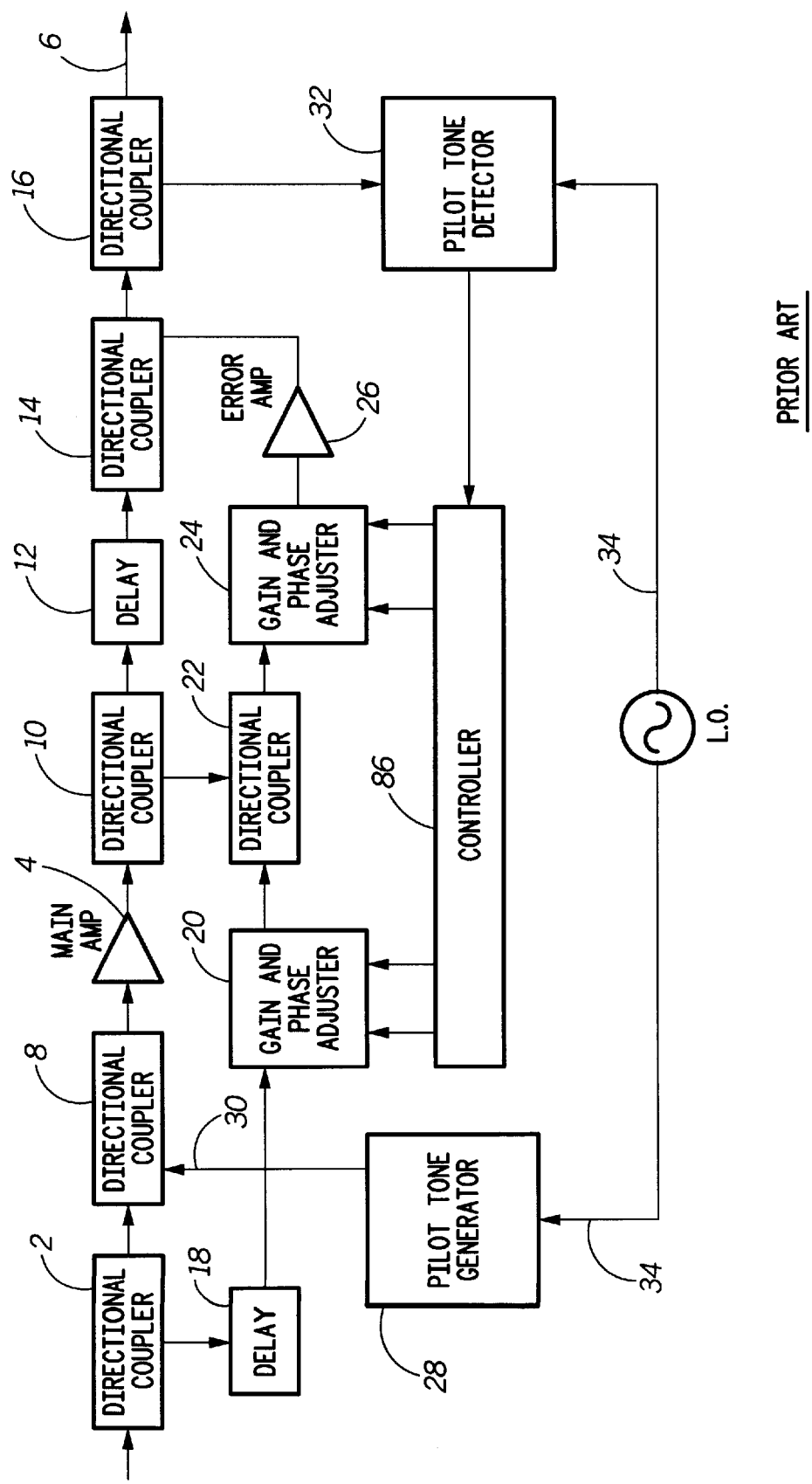
FIG. 1 is a block diagram of a prior art feedforward amplifier network with frequency swept pilot tone distortion reduction.
Figure 2:
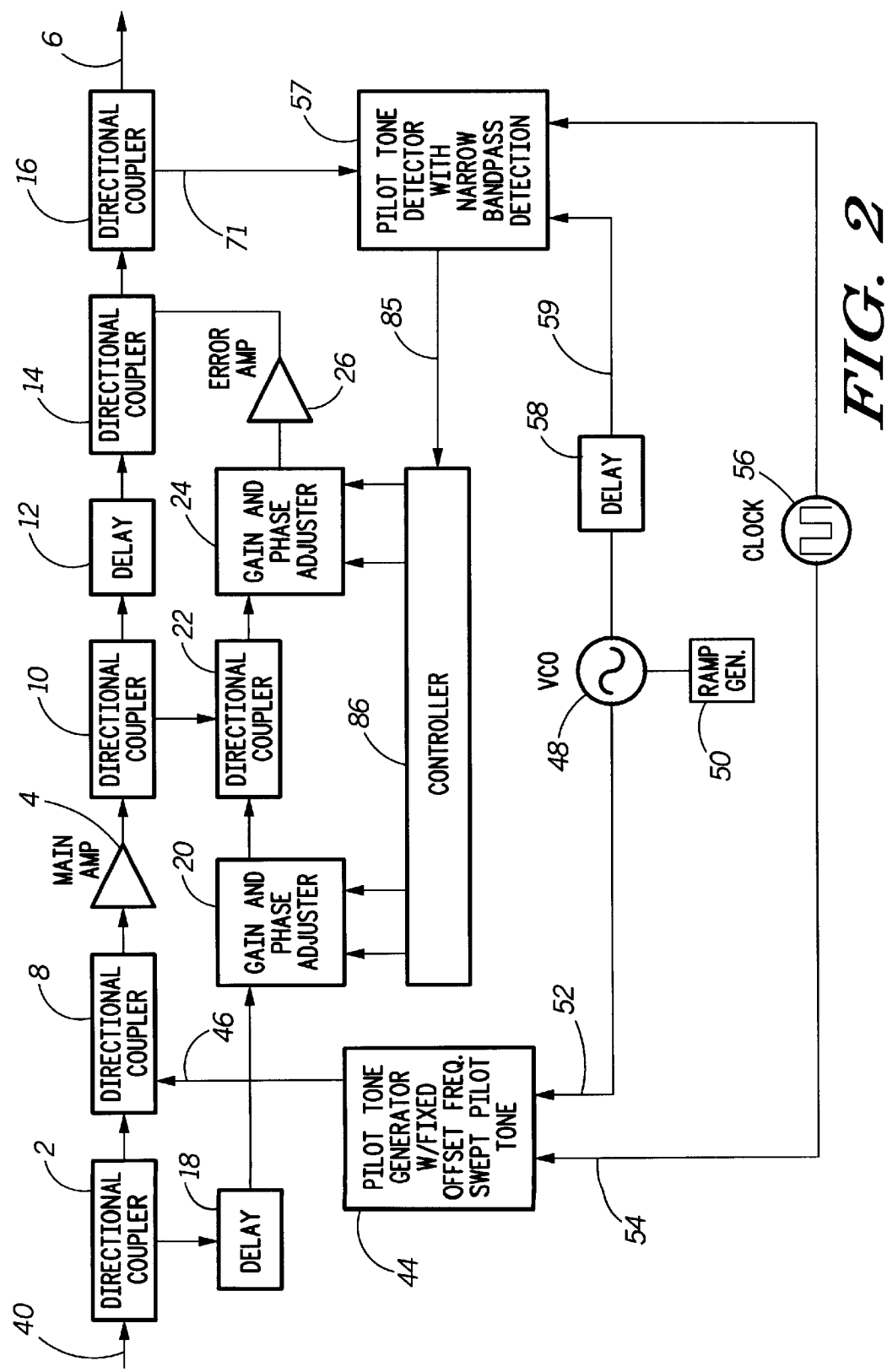
FIG. 2 is a feedforward amplifier network for reducing distortion generated by a power amplifier in accordance with one embodiment of the invention.

FIG. 2 shows one embodiment of the invention where an input signal 40, such as a plurality of code division multiple access signals, is input into a feedforward amplifier network 42 for reducing distortion generated by power amplifier 4. The input signal 40 may be for example a plurality of CDMA signals such as 1.23 MHz bandwidth channels with channel separation approximately equal to the channel bandwidth covering a total bandwidth of up to 25 MHz, for example in a 900 MHz cellular radiotelephone system. The feedforward amplifier network 42 includes many of the same blocks as indicated in FIG. 1 and are therefore given the same reference numerals. A different pilot tone generator 44 block generates a fixed offset frequency swept pilot tone over a defined frequency band including the frequency band of the input signal of the power amplifier. A voltage controlled oscillator 48 is controlled by a ramp generator 50 to produce a rapidly swept frequency modulated (FM) signal, sometimes referred to as a chirp signal, resulting in a variable frequency reference signal 52 that is sent to the pilot tone generator 44. The pilot tone generator 44 mixes the variable frequency reference signal 52 with a pair of quadrature phase sinusoidal signals derived from fixed pilot tone clock signal 54 from clock 56 to produce a fixed offset frequency swept pilot tone 46 which is slightly offset in frequency from that of the variable frequency reference signal 52.

In addition, the feedforward amplifier network 42 includes a pilot tone detector 57 and a delay block 58 which may be a coil of transmission line or delay filter which delays the variable frequency reference signal 52 to pilot tone detector 57. This delayed variable frequency reference signal 59 is used as the local oscillator for the pilot tone detector 57. This delayed variable frequency reference signal is mixed with an output from directional coupler 16 to produce an intermediate frequency signal (see FIG. 4) at the offset frequency.

The variable frequency reference signal 52 is delayed by delay block 58 for a period of time equal to the propagation delay from the output of a voltage controlled oscillator 48 through a pilot tone generator 44, directional coupler 8, main amplifier 4, directional coupler 10, delay block 12, directional coupler 14 and directional coupler 16. This delay is necessary, since one goal of the invention is to modulate the variable frequency reference signal 52 at the maximum possible rate, which may be several hundred megahertz per second. The delay through the main RF path will cause the output at directional coupler 16 to be at a different frequency than the output of the pilot tone generator 44, due to this fast FM sweep. Delaying the input to the pilot tone detector 57 compensates for this frequency shift by inducing a corresponding frequency shift embodied in the delayed variable frequency reference signal 59.

FIG. 3 shows a more detailed block diagram of the pilot tone generator 44 showing the fixed pilot tone clock signal 54 being divided down by a dual divider 60 (or a sine and cosine lookup table). The dual divider 60 preferably divides the fixed pilot tone clock signal 54 down to a frequency in the audio range such as 1 kHz. The dual divider 60 is preferably a dual output type divider where the two outputs are in-phase and quadrature (I and Q) outputs. These outputs are filtered by low pass filters 62 and 64 to produce sinusoidal offset frequency signals 65a and 65b to a single side band upconverter (SSBC) 66. The SSBC upconverter 66 mixes the inphase and quadrature sinusoidal offset frequency signals 65a and 65b with quadrature phased variable frequency reference signal 52 from voltage controlled oscillator 48 to produce the fixed offset frequency pilot tone 46 which is at a frequency higher (or lower) than the variable frequency reference signal 52 by an amount equal to the output frequency from dual divider 60, while suppressing outputs at the voltage controlled oscillator 48 frequency and at the undesired mixing product or opposite side band frequencies.

Hence the pilot tone generator 44 generates a fixed offset frequency swept pilot tone 46 which is injected into the input path of the power amplifier's input signal. With the use of the dual divider 60 and side band upconverter or mixer 66, the use of phase locked loops and associated software is eliminated, thereby helping to reduce the complexity of the power amplifier network to allow for smaller sized amplifier networks.

In addition, other feedforward amplifier networks do not eliminate DC offset. The use of the upconverter 66 in the pilot tone generator 44 and mixer 70 in the pilot tone detector 57 help eliminate potential DC offset problems.

FIG. 4 is a block diagram of the pilot tone detector 57 having a mixer 70 that receives the delayed variable frequency reference signal 59 and output 71 from directional coupler 16. The mixer 70 mixes a sample of the linear power amplifier output 71 from the directional coupler 16 and the delayed variable frequency reference signal to generate an intermediate frequency (IF) output 72. The IF output 72 of mixer 70 is set at the same frequency as the output of dual divider 60 in FIG. 3. The IF output 72 is filtered in broadband bandpass filter 74 to avoid overloading of subsequent amplifier 76. The broadband bandpass filter 74 filters the IF output 72 in order to remove the large signals at undesired frequencies produced when the voltage controlled oscillator 48 sweeps past the carrier signals coming from the directional coupler 16. Bandpass filter 74 is preferably a passive filter which has no dynamic range limitation, but whose bandwidth may be a few orders of magnitude higher than the desired bandwidth. The output from bandpass filter 74 is amplified by amplifier 76 and received by narrow band amplitude detector 77. The narrow band amplitude detector 77 includes a narrow bandpass filter 78 to produce an output signal 80 having the final desired bandwidth and an amplitude within the dynamic range of detector 82. The narrow bandpass filter 78 has a bandwidth of about 1 Hz–10 Hz. The narrow bandpass filter 78 also receives the fixed pilot tone clock signal 54 from clock 56 to synchronize the pilot tone detector 57 with the pilot tone generator 44 so that the pilot tone detector 57 can derive the offset of the fixed offset frequency swept pilot tone signal 46 generated by the pilot tone generator 44. In an alternative embodiment, the fixed pilot tone clock signal 54 need not be sent to the pilot tone detector 44 if the pilot tone detector 44 is pre-tuned to the fixed offset frequency of signals 65a and 65b.

Detector 82 then detects the power of the output signal from the narrow bandpass filter 78 and converts the power level to a DC level. The detector 82 detects an average pilot tone energy level within the amplified output signal from directional coupler 16. The output from detector 82 is then passed through a low pass filter, or averaged, by low pass filter 84 and sent to controller 86 (see FIG. 2). The output from low pass filter 84 is an indication of the detected pilot level.

As mentioned, the narrow bandpass filter 78 is preferably a narrow band frequency bandpass filter having a bandwidth of between 1 Hz and 10 Hz. Because of the narrow bandwidth requirement, the bandpass filter 78 must have a high Q factor. One way to achieve this level of Q and bandwidth at audio frequencies is to use an active filter. Another alternative is to digitize the output of amplifier 76 using an analog to digital (A/D) converter and to use a digital signal processor to digitally perform the filtering and detection functions provided by components 78, detector 82 and low pass filter 84. The digital signal processor would also require an input from the clock 56 in order to synchronize its filter pass band with the down converted pilot signal from mixer 70. The digital signal processor could also provide more advanced functions such as multiple frequency filtering and detection to accommodate additional filtering if desired.

Referring back to FIG. 2, the output 71 from directional coupler 16 is delivered to the pilot tone detector 57 where pilot tone detector output signal 85 is generated. The pilot tone detector output signal 85 represents an average pilot tone energy level within the main amplifier output path. As known in the art, the pilot tone detector output signal 85 is used by the controller 86 to determine the average pilot tone energy level within the main amplifier output path. In response to the detection, controller 86, as known in the art, adjusts the gain and phase characteristics of gain and phase adjuster 24 to eliminate both the pilot tone signal present in signal 71 and thus the distortion introduced by the power amplifier 4. The amplitude and the phase of the error signal determined from the pilot tone detector output signal 85 is modified in amplitude and phase adjuster 24, amplified in error amplifier 26 and routed to directional coupler 14 where it is subtracted from the output of the main amplifier 4 via directional coupler 10 and delay 12. The time delay of delay 12 is set to compensate for the signal delay through directional coupler 22, gain and phase adjuster 24 and error amplifier 26. If the amplitude and the phase of the error signal is properly adjusted, the distortion component of the main signal path will be canceled, resulting in a clean signal at the main signal path output 6.

The controller 86 may consist of an analog digital converter, such as a digital voltmeter, for converting the detected pilot tone energy level into a digital representation, for use by a microprocessor, programmed to adjust the gain and phase characteristics of gain and phase adjuster 24. Under this approach, it is no longer necessary to make several gain and phase adjustments at successive frequencies before the desired degree of cancellation is achieved. Instead, by sampling the pilot tone energy level once per frequency sweep and averaging those values together to determine an average pilot tone energy level, cancellation of both pilot tone and distortion over the whole of the amplifier's network operating band is achieved at the same time.

It should be understood that the implementation of other variations and modifications of the invention in its various aspects will also be apparent to those of ordinary skill in the art, and that the invention is not limited by the specific embodiments described. For example, the controller need not be a microprocessor controlled device. It is therefore contemplated to cover by the present invention, any and all modifications, variations, or equivalents that fall within the spirit and scope of the basic underlying principles disclosed and claimed herein.

What I claim is:

1. A feedforward amplifier network for reducing distortion generated by a power amplifier comprising:

means for generating a fixed offset frequency swept pilot tone over at least a same frequency band as an input signal of the power amplifier as a function of a variable frequency reference signal and a fixed pilot tone clock signal by mixing the variable frequency reference signal and offset frequency signals to produce the fixed offset frequency pilot tone, wherein the frequency swept pilot tone is injected into a main signal path of the power amplifier's input signal;

means, operatively coupled to the variable frequency reference signal, for delaying the variable frequency reference signal; and means, operatively coupled to an output path of the power amplifier and to the delay means, for detecting the fixed offset frequency swept pilot tone within the output path by employing a narrow band amplitude detector to facilitate detection of the fixed offset frequency swept pilot tone in at least a same frequency band as the input signal.

2. The feedforward amplifier network of claim 1 wherein the narrow band amplitude detector includes a narrow bandpass filter having a bandwidth of between 1–10 Hz.

3. The feedforward amplifier network of claim 2 wherein the input signal is comprised of at least one code division multiple access signal.

4. The feedforward amplifier network of claim 1 wherein the means for detecting is operatively coupled to the fixed pilot tone clock signal to facilitate synchronization of the means for generating and the means for detecting so that the means for detecting can derive an offset of the fixed offset frequency swept pilot tone signal.

5. The feedforward amplifier network of claim 1 wherein the means for detecting the fixed offset frequency swept pilot tone includes means for mixing a delayed variable frequency reference signal from the delay means and amplifier output from the output path to generate an intermediate frequency (IF) output.

6. A feedforward amplifier network for reducing distortion generated by a power amplifier comprising:

means for generating a fixed offset frequency swept pilot tone over at least a same frequency band as an input signal of the power amplifier as a function of a variable frequency reference signal and a fixed pilot tone clock signal by mixing the variable frequency reference signal and offset frequency signals to produce the fixed offset frequency pilot tone, wherein the frequency swept pilot tone is injected into an input path of the power amplifier's input signal;

means, operatively coupled to the variable frequency reference signal, for delaying the variable frequency reference signal; and means, operatively coupled to an output path of the power amplifier, to the delay means and to the fixed pilot tone clock signal, for detecting the fixed offset frequency swept pilot tone within the output path by employing a narrow band amplitude detector having a bandwidth of between 1 Hz–10 Hz to facilitate detection of the fixed offset frequency swept pilot tone in at least a same frequency band as the input signal wherein the means for detecting is not phase locked to the variable frequency reference signal.

7. The feedforward amplifier network of claim 6 wherein the means for detecting is operatively coupled to the fixed pilot tone clock signal to facilitate synchronization of the means for generating and the means for detecting so that the means for detecting can derive an offset of the fixed offset frequency swept pilot tone signal.

8. The feedforward amplifier network of claim 6 wherein the means for detecting the fixed offset frequency swept pilot tone includes means for mixing a delayed variable frequency reference signal from the delay means and amplifier output from the output path to generate an intermediate frequency (IF) output.

9. A method for reducing distortion generated by a power amplifier comprising the steps of:

generating a fixed offset frequency swept pilot tone over at least a same frequency band as an input signal of the power amplifier as a function of a variable frequency reference signal and a fixed pilot tone clock signal by mixing the variable frequency reference signal and offset frequency signals to produce the fixed offset frequency pilot tone, wherein the frequency swept pilot tone is injected into an input path of the power amplifier's input signal;

delaying the variable frequency reference signal; and detecting the fixed offset frequency swept pilot tone within the output path by employing a narrow band amplitude detector to facilitate detection of the fixed offset frequency swept pilot tone in a same frequency band as the input signal based on the delayed variable frequency reference signal.

10. The method of claim 9 wherein the step of detecting includes employing a narrow band amplitude detector having a bandpass of between 1 Hz–10 Hz.

11. The method of claim 9 wherein the step of detecting includes synchronizing means for generating the fixed offset frequency swept pilot tone with means for detecting the fixed offset frequency swept pilot tone so that the means for detecting can derive an offset of the fixed offset frequency swept pilot tone signal.

12. The method of claim 9 wherein the step of detecting includes mixing a delayed variable frequency reference signal and amplifier output from the output path to generate an intermediate frequency (IF) output.

* * * * *